(12) United States Patent
Horng

(10) Patent No.: US 7,515,414 B2
(45) Date of Patent: Apr. 7, 2009

(54) MINI-SIZED HEAT-DISSIPATING MODULE HAVING AN ENGAGING STRUCTURE

(75) Inventor: Alex Horng, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 31 days.

(21) Appl. No.: 11/727,116

(22) Filed: Mar. 23, 2007

(65) Prior Publication Data

US 2008/0174958 A1    Jul. 24, 2008

(30) Foreign Application Priority Data

Jan. 23, 2007    (TW) ............................... 96102482 A

(51) Int. Cl.
*H05K 7/20* (2006.01)
*F28F 7/00* (2006.01)

(52) U.S. Cl. ...................... 361/697; 165/80.3; 165/121; 361/695

(58) Field of Classification Search ................ 165/121, 165/122; 361/697, 703
See application file for complete search history.

(56) References Cited

U.S. PATENT DOCUMENTS

| | | | | | |
|---|---|---|---|---|---|
| 5,309,983 | A | * | 5/1994 | Bailey | ........................ 165/80.3 |
| 5,478,221 | A | * | 12/1995 | Loya | ........................... 417/313 |
| 5,526,875 | A | * | 6/1996 | Lin | ............................. 165/80.3 |
| 5,566,749 | A | * | 10/1996 | Jordan et al. | ................ 165/80.3 |
| 5,615,084 | A | * | 3/1997 | Anderson et al. | ........... 361/697 |
| 5,957,659 | A | * | 9/1999 | Amou et al. | ................. 415/178 |
| 6,145,586 | A | | 11/2000 | Lo et al. | |
| 6,340,291 | B1 | * | 1/2002 | Reckert | ...................... 416/185 |
| 6,496,368 | B2 | | 12/2002 | Jui-Yuan | |
| 6,717,814 | B2 | * | 4/2004 | Li | ............................... 361/704 |
| 6,779,595 | B1 | * | 8/2004 | Chiang | .................. 165/104.33 |
| 6,781,834 | B2 | * | 8/2004 | Nair et al. | .................... 361/697 |
| 7,040,384 | B2 | * | 5/2006 | Shiang-Chich | .............. 165/122 |
| 7,355,146 | B2 | * | 4/2008 | Angelis et al. | .............. 219/202 |
| 2007/0035926 | A1 | * | 2/2007 | Xia et al. | ..................... 361/695 |
| 2007/0247009 | A1 | * | 10/2007 | Hoffman et al. | .............. 310/51 |

* cited by examiner

*Primary Examiner*—Gregory D Thompson
(74) *Attorney, Agent, or Firm*—Muncy, Geissler, Olds & Lowe, PLLC

(57) ABSTRACT

A mini-sized heat-dissipating module includes a miniature heat-dissipating plate and a miniature fan unit. The miniature heat-dissipating plate has an assembling space, at least one airflow channel and at least two engaging members. The assembling space, the airflow channel and the engaging members are provided on a top surface of the miniature heat-dissipating plate, wherein the assembling space is arranged between the two engaging members. The miniature fan unit has an air inlet, an air outlet and a fan wheel. The miniature fan unit is securely engaged between the two engaging members of the miniature heat-dissipating plate when assembled. The fan wheel of the miniature fan unit takes up a maximum area less than 1.6 cm$^2$ for rotation.

12 Claims, 5 Drawing Sheets

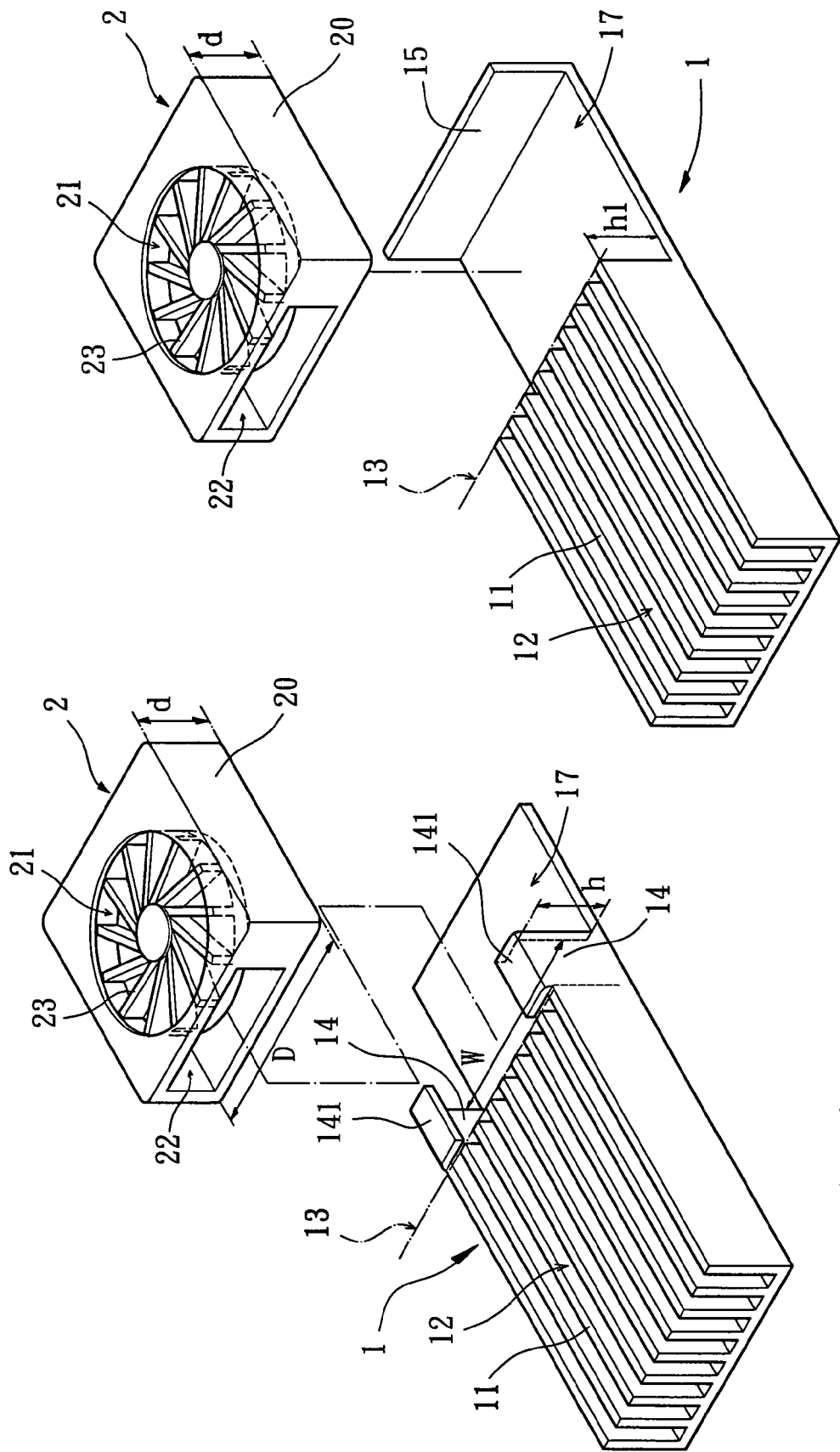

MINI-SIZED HEAT-DISSIPATING MODULE HAVING AN ENGAGING STRUCTURE

BACKGROUND OF THE INVENTION

1. Field of the Invention

The present invention relates to a mini-sized heat-dissipating module having an engaging structure. Particularly, the present invention relates to the mini-sized heat-dissipating module, including a miniature heat-dissipating plate and a miniature fan unit. More particularly, the present invention relates to the miniature heat-dissipating plate of the mini-sized heat-dissipating module having at least two engaging members to securely mount the miniature fan unit thereon.

2. Description of the Related Art

Referring initially to FIG. 1, a conventional small-sized heat-dissipating module generally includes a heat sink member 7, a plurality of fixing elements 8 and a fan unit 9. The heat sink member 7 has a top surface on which to provide a plurality of fins 71 and a plurality of airflow channels 72. Each of the airflow channels 72 is formed between any two of the adjacent fins 71. Several assembling holes 73 are provided on a bottom plate of the heat sink member 7 to extend through the fixing elements 8 for assembling the small-sized heat-dissipating module. The fixing element 8 includes a resilient fastening member 81, an engaging shoulder 82 and an elastic member (i.e. spring member) 83. The resilient fastening member 81 is constructed on a first end of the fixing element 8, and is configured as a barb-like structure. A slit (unlabeled) is formed at the resilient fastening member 81 to provide a compressible space such that the structure of the resilient fastening member 81 is compressible in assembling operation. In addition, the engaging shoulder 82 is correspondingly constructed on a second end of the fixing element 8.

In assembling operation of the small-sized heat-dissipating module, the rod body of the fixing element 8 can pass through the elastic member 83 such that the entire section of the elastic member 83 is confined between the resilient fastening member 81 and the engaging shoulder 82 for avoiding unwanted or unexpected release. Each corner portion of the fan unit 9 includes a through hole 91 to extend through the fixing element 8 and to be aligned with the associated assembling hole 73 of the heat sink member 7 if they are stacked each other.

In initially assembling operation of the small-sized heat-dissipating module, the through hole 91 of the fan unit 9 and the assembling hole 73 of the heat sink member 7 are aligned with each other. Each resilient fastening member 81 of the fixing elements 8 is successively extended through the through hole 91 of the fan unit 9 and the assembling hole 73 of the heat sink member 7. In this circumstance, each resilient fastening member 81 of the fixing element 8 may be compressed to pass through the through hole 91 of the fan unit 9 and the assembling hole 73 of the heat sink member 7. Once passed, the resilient fastening member 81 of the fixing element 8 can automatically expand its original diameter of the barb-like structure such that the resilient fastening member 81 of the fixing element 8 engages with a peripheral edge of the assembling hole 73 of the heat sink member 7.

To maintain contact within the stacked component configuration (fan unit 9 and heat sink member 7, or heat sink member 7 and fixing element 8), a stress force of the elastic member 83 with an appropriate spring rate is exerted between the fixing element 8 and the fan unit 9. In heat-dissipating operation, the fan unit 9 serves to generate a cooling airflow through the airflow channels 72 of the heat sink member 7 which is mounted to a heat source (not shown, e.g. IC component).

Currently, an electronic component (not shown, e.g. computer chip or microprocessor) is widely equipped with the heat-dissipating module for removing heats surrounding it. As the size of the electronic component has become increasingly reduced, there has been an increased need for reducing the size of the small-sized heat-dissipating module. A number of design limitations and drawbacks exist for the above-mentioned heat-dissipating module. In other words, the small-sized heat-dissipating module is unsuitable for applying to a miniature electronic component without any modification. However, the functional disadvantages of the small-sized heat-dissipating module in applying to the miniature electronic component are as follows: by way of example, there is a need for providing the fixing element 8 in assembling the stacked configuration of the heat-dissipating module. In addition to this, there are additional spaces for providing the assembling holes 73 of the heat sink member 7 and the through holes 91 of the fan unit 9 to receive the fixing elements 8. This results in a hard degree of reducing the size of the small-sized heat-dissipating module which is unsuitable for applying to the miniature electronic component. Accordingly, there is a need for redesigning the heat-dissipating module in applying to the miniature electronic component.

As is described in greater detail below, the present invention intends to provide a mini-sized heat-dissipating module, including a miniature heat-dissipating plate and a miniature fan unit. The miniature heat-dissipating plate provides at least two engaging members so as to securely mount the miniature fan unit thereon in such a way as to mitigate and overcome the above problem. A fan wheel of the miniature fan unit takes up a maximum area less than 1.6 cm$^2$ for rotation such that the heat-dissipating module is minimized for a miniature electronic component.

SUMMARY OF THE INVENTION

The primary objective of this invention is to provide a mini-sized heat-dissipating module, including a miniature heat-dissipating plate and a miniature fan unit. The miniature heat-dissipating plate provides at least two engaging members so as to securely mount the miniature fan unit on the miniature heat-dissipating plate without the need of using any fixing element. Accordingly, the entire structure of the mini-sized heat-dissipating module is simplified.

The secondary objective of this invention is to provide the mini-sized heat-dissipating module, wherein a fan wheel of the miniature fan unit takes up a maximum area less than 1.6 cm$^2$ for rotation. Accordingly, the size of the heat-dissipating module is minimized for a miniature electronic component.

The mini-sized heat-dissipating module in accordance with an aspect of the present invention includes a miniature heat-dissipating plate and a miniature fan unit. The miniature heat-dissipating plate has an assembling space, at least one airflow channel and at least two engaging members. The assembling space, the airflow channel and the engaging members are provided on a top surface of the miniature heat-dissipating plate, wherein the assembling space is arranged between the two engaging members. The miniature fan unit has an air inlet, an air outlet and a fan wheel. The miniature fan unit is securely engaged between the two engaging members of the miniature heat-dissipating plate when assembled.

In a separate aspect of the present invention, the fan wheel of the miniature fan unit takes up a maximum area less than 1.6 cm$^2$ for rotation.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is an exploded perspective view illustrating a mini-sized heat-dissipating module in accordance with a first embodiment of the present invention;

FIG. 3 is an exploded perspective view illustrating a mini-sized heat-dissipating module in accordance with a second embodiment of the present invention;

DETAILED DESCRIPTION OF THE INVENTION

Figure 1:
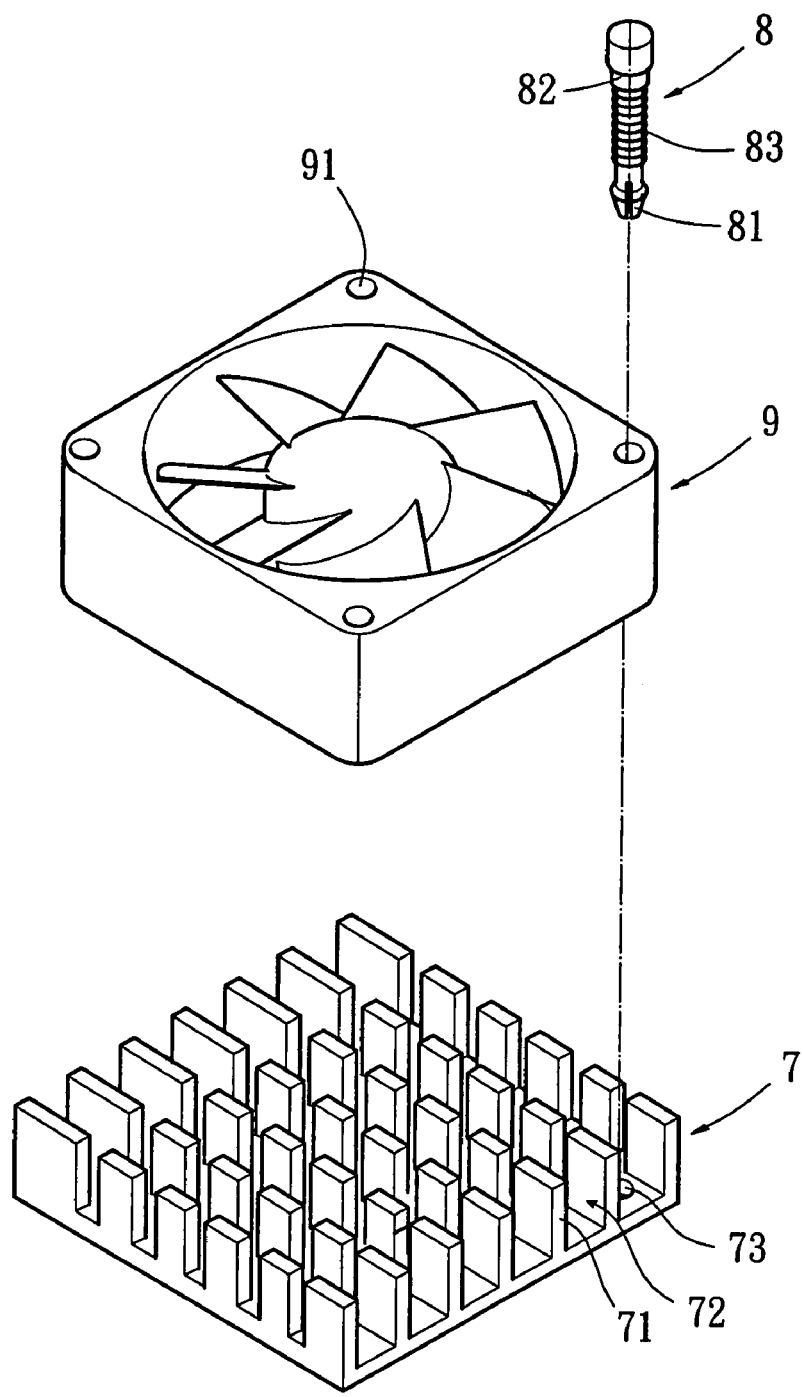
FIG. 1 is an exploded perspective view illustrating a conventional small-sized heat-dissipating module in accordance with the prior art.

Referring now to FIG. 2, an exploded perspective view of a mini-sized heat-dissipating module in accordance with the first embodiment of the present invention is illustrated. In this preferred embodiment, the mini-sized heat-dissipating module includes a miniature heat-dissipating plate designated numeral 1 and a miniature fan unit designated numeral 2. The miniature fan unit 2 is supported on the miniature heat-dissipating plate designated numeral 1 mounted to a heat source (not shown). In the present invention, the term "miniature heat-dissipating plate or miniature fan unit" used herein means a component of the heat-dissipating module limited to apply to a miniature size of an electronic component. When used herein in connection with the miniature electronic component, the term "miniature" refers to the size of the electronic component, regardless of its function or performance.

Constructions of the miniature heat-dissipating plate 1 shall be described in detail, with reference to FIG. 2. The miniature heat-dissipating plate 1 is preferably made from metal, such as aluminum, copper, gold, silver or alloy thereof, having good thermal conductivity. In this preferred embodiment, the miniature heat-dissipating plate 1 is provided with a plurality of fins 11, at least one airflow channel 12, at least two engaging members (i.e., engaging legs) 14 and an assembling space 17. The fins 11, the airflow channel 12, the engaging members 14 and the assembling space 17 are arranged on an upper surface of the miniature heat-dissipating plate 1. Two sidewalls define the airflow channel 12 that has two ends and parallelly extends along the upper surface from one of the two ends to the other. Any two adjacent fins 11 disposed in the airflow channel 12 define a longitudinal groove so as to increase the total thermal-exchanging area of the miniature heat-dissipating plate 1. Consequently, the miniature heat-dissipating plate 1 is so configured to have a higher heat-dissipating efficiency. Preferably, the assembling space 17 of the miniature heat-dissipating plate 1 is arranged between the two engaging members 14 and adjacent to one of the two ends of the airflow channel 12. The engaging members 14 are provided for easy guidance of the miniature fan unit 2 in a longitudinal direction of the miniature heat-dissipating plate 1, even when the miniature heat-dissipating plate 1 and the miniature fan unit 2 are not in perfect alignment with each other.

With continued reference to FIG. 2, distal ends of the fins 11 of the miniature heat-dissipating plate 1 define an engaging portion 13 (acting as engaging member) adjacent to the assembling space 17 to engage with the miniature fan unit, 2. Preferably, each of the sidewalls of the miniature heat-dissipating plate 1 longitudinally extends to provide an extension wall to form the engaging members 14. Each distal end of the engaging members 14 is bent to form an inwardly bent lug 141 for positioning the miniature fan unit 2.

Constructions of the miniature fan unit 2 shall be described in detail, with reference to FIG. 2. The miniature fan unit 2 may be selected from an axial flow type or a blower type. In this preferred embodiment, the miniature fan unit 2 is in the form of a blower type having an axial air inlet and a side air outlet. The miniature fan unit 2 includes a housing body 20, an air inlet 21, a side air outlet 22 and a fan wheel 23. The housing body 20 has an interior (unlabeled) to receive the fan wheel 23. The air inlet 21 is provided on a side of the housing body 20 while the side air outlet 22 is provided on an outer circumferential sidewall. In assembling operation, the side air outlet 22 is facing, aligned and connected with one of the two ends of the airflow channel 12 of the miniature heat-dissipating plate 1 and the engaging portion 13 as well. In this preferred embodiment, the air outlet 22 is connected with said end of the airflow channel 12 of the miniature heat-dissipating plate 1.

The term "miniature fan unit" used herein defines the fan unit having a reduced size of the fan wheel taken up a maximum area less than $1.6 \text{ cm}^2$ for rotation so that the size of the heat-dissipating module can be further reduced. Accordingly, the mini-sized heat-dissipating module can be equipped in a miniature electronic device (e.g. minicomputer, PDA (personal digital assistance) and cellular phone).

The miniature fan unit 2 lies flat on a bottom surface of the miniature heat-dissipating plate 1. The material of the miniature heat-dissipating plate 1 may provide a desired amount of resiliency so that the engaging member 14 has a degree of flexibility and thus provides the spring action on the miniature fan unit 2. In assembling operation, the miniature fan unit 2 is engaged between the engaging members 14 of the miniature heat-dissipating plate 1. When the miniature fan unit 2 is completely inserted into the assembling space 17, the engaging portion 13 of the miniature heat-dissipating plate 1 engages with the sidewall of the miniature fan unit 2 on which the side air outlet 22 is provided. To accomplish a greater assembled relationship, the two engaging members 14 located opposite sides of the assembling space 17 defines a width (identified as "W") slightly smaller than a width (identified as "D") of the miniature fan unit 2 so that the housing body 20 is securely engaged between the two engaging members 14 for completing the assembly of the mini-sized heat-dissipating module. Preferably, each of the engaging members 14 defines a vertical height (identified as "h") slightly smaller than a thickness (identified as "d") of the miniature fan unit 2. In this manner, each inwardly bent lug 141 of the engaging members 14 exerts a desired downward force on the housing body 20 of the miniature fan unit 2. Consequently, any unwanted disengagement of the miniature fan unit 2 from the miniature heat-dissipating plate 1 can be avoided.

Still referring to FIG. 2, the miniature heat-dissipating plate 1 and the miniature fan unit 2 of the present invention are combined without the need of providing an additional fastening member (e.g. screw nut, clip or fastener) in implementing the preferred embodiment. Advantageously, the process of assembling the mini-sized heat-dissipating module and the entire structure thereof are simplified.

In heat-dissipating operation, the side air outlet 22 of the miniature fan unit 2 is aligned with distal ends of the longitudinal grooves formed in the airflow channel 12. Ambient air is sucked into the air inlet 21 and airflow are exhausted from the side air outlet 22 such that cooling air can pass through the longitudinal grooves of the airflow channel 12. Finally, heated air can be discharged from another distal end of the longitudinal grooves located at the other one of the two ends of the airflow channel 12 of the miniature heat dissipating plate 1.

Turning now to FIG. 3, an exploded perspective view of a mini-sized heat-dissipating module in accordance with the second embodiment of the present invention is illustrated. In comparison with the first embodiment, the miniature heat-dissipating plate 1 of the second embodiment has a distal end from which an upright bent end wall is extended to form an engaging member 15 of the miniature heat-dissipating plate 1. In a preferred embodiment, the engaging member 15 is integrally formed and extended from an end edge of the miniature heat-dissipating plate 1. Defined between the engaging portion 13 and the engaging member 15 is the assembling space 17 so as to simplify the entire structure, and is preferably a length (across the assembling space 17) slightly smaller than the width of the miniature fan unit 2 so that the housing body 20 is securely engaged between the engaging portion 13 and the engaging member 15 for completing the assembly of the mini-sized heat-dissipating module. In a preferred embodiment, each top of the fins 11 is designed to have a vertical height (identified as "h1") not greater than a thickness (identified as "d") of the housing body 20 so as not to increase dimensions of the mini-sized heat-dissipating module.

Figure 4:
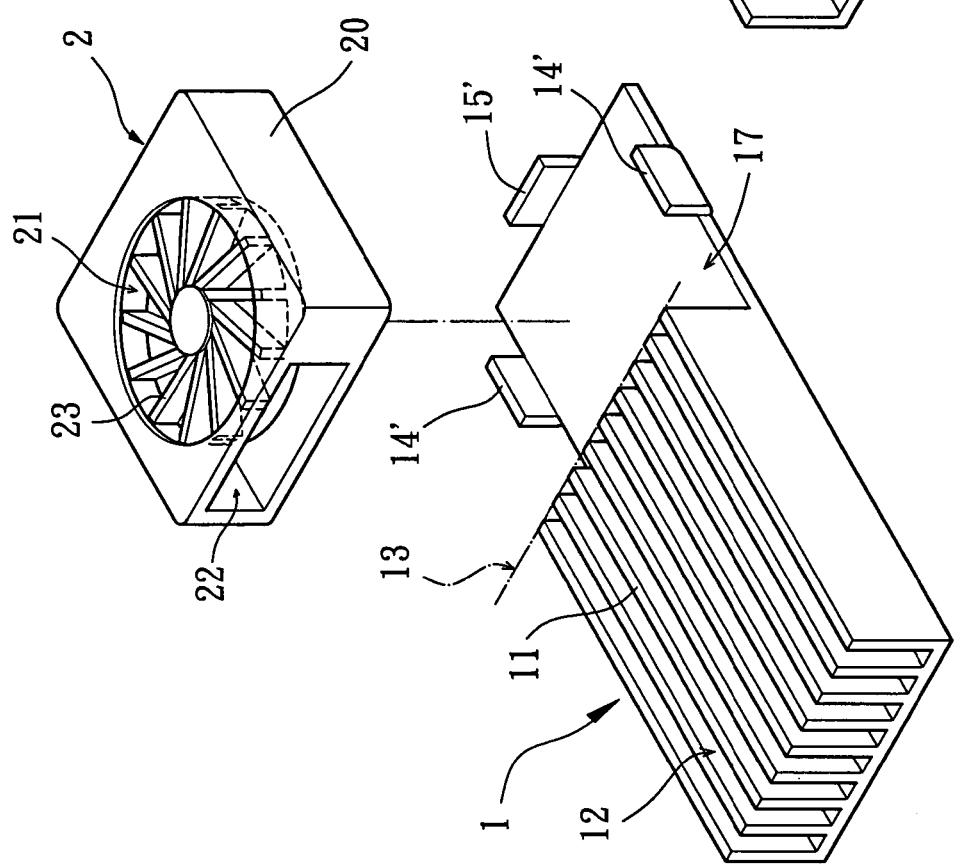
FIG. 4 is an exploded perspective view illustrating a mini-sized heat-dissipating module in accordance with a third embodiment of the present invention.

Turning now to FIG. 4, an exploded perspective view of a mini-sized heat-dissipating module in accordance with the third embodiment of the present invention is illustrated. In comparison with the first embodiment, the first engaging members 14' and the second engaging member 15' of the miniature heat-dissipating plate 1 of the third embodiment are of upright bent flanges extended from peripheral edges of the assembling space 17. In a preferred embodiment, the first engaging members 14' and the second engaging member 15' are integrally formed and extended from edges of the miniature heat-dissipating plate 1. The desired size of the upright bent flange can be designed to save the material of the miniature heat-dissipating plate 1. Once assembled, the housing body 20 is securely engaged between the engaging portion 13 and the second engaging member 15' along a longitudinal direction of the miniature heat-dissipating plate 1, and is securely engaged between the two first engaging member 14' along a transverse direction of the miniature heat-dissipating plate 1.

Figure 5:
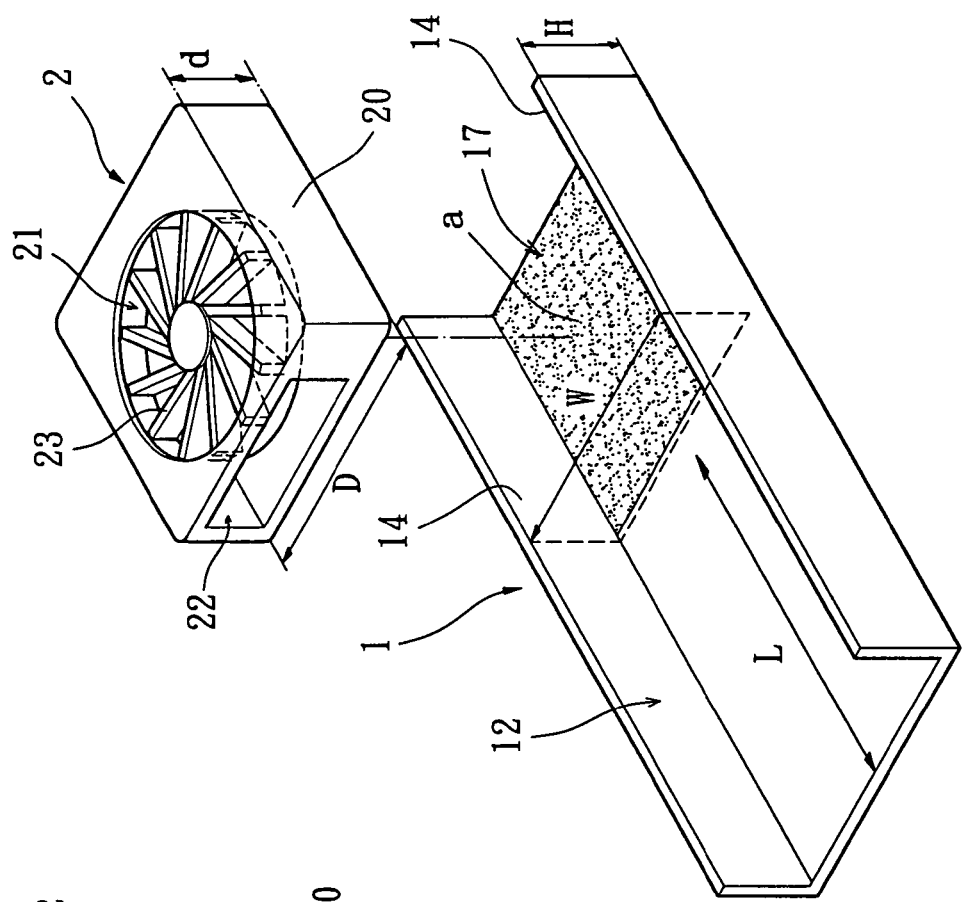
FIG. 5 is an exploded perspective view illustrating a mini-sized heat-dissipating module in accordance with a fourth embodiment of the present invention.

Turning now to FIG. 5, an exploded perspective view of a mini-sized heat-dissipating module in accordance with the fourth embodiment of the present invention is illustrated. In comparison with the first embodiment, each of the sidewalls of the miniature heat-dissipating plate 1 of the fourth embodiment extends to provide an extension wall to form the engaging member 14 which terminates at the distal end of the miniature heat-dissipating plate 1. In this preferred embodiment, the fins 11 of the miniature heat-dissipating plate 1 are omitted to simplify the entire structure due to the fact that the width or size of the airflow channel 12 narrows or is too small. To further reduce the size of the heat-dissipating module, a desired length (identified as "L") of the airflow channel 12 is provided. The two engaging members 14 define the assembling space 17, as shown at a region defined by a dotted line in FIG. 5. Preferably, the assembling space 17 has a width (identified as "W") slightly smaller than a width (identified as "D") of the miniature fan unit 2 so that the housing body 20 is securely engaged between the two engaging members 14. Once assembled, the side air outlet 22 of the miniature fan unit 2 is located in the airflow channel 12 of the miniature heat-dissipating plate 1.

Figure 6:
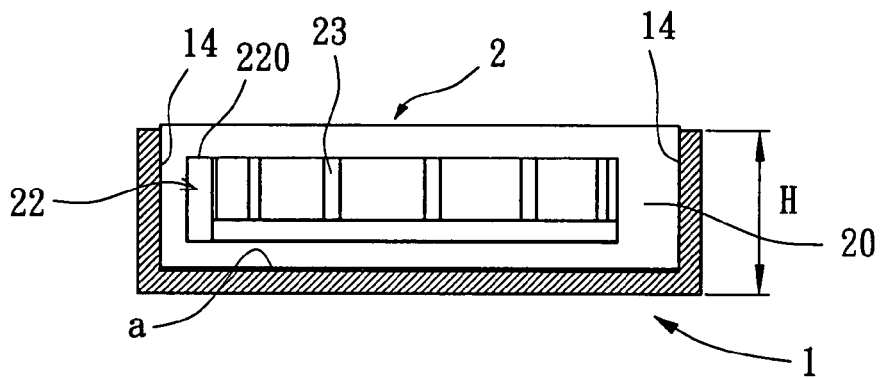
FIG. 6 is a cross-sectional view illustrating the mini-sized heat-dissipating module in accordance with the fourth embodiment of the present invention.

Turning now to FIG. 6, a cross-sectional view of the mini-sized heat-dissipating module in accordance with the fourth embodiment of the present invention is illustrated. Preferably, each top of the engaging members 14 is designed to have a vertical height (identified as "H") not higher than a thickness (identified as "d") of the housing body 20 and not lower than a top edge 220 of the side air outlet 22 of the miniature fan unit 2. In a preferred embodiment, an adhesive layer "a" is disposed between a bottom surface of the assembling space 17 and an under surface of the miniature fan unit 2 so as to enhance the assembled reliability of the mini-sized heat-dissipating module.

Figure 7:
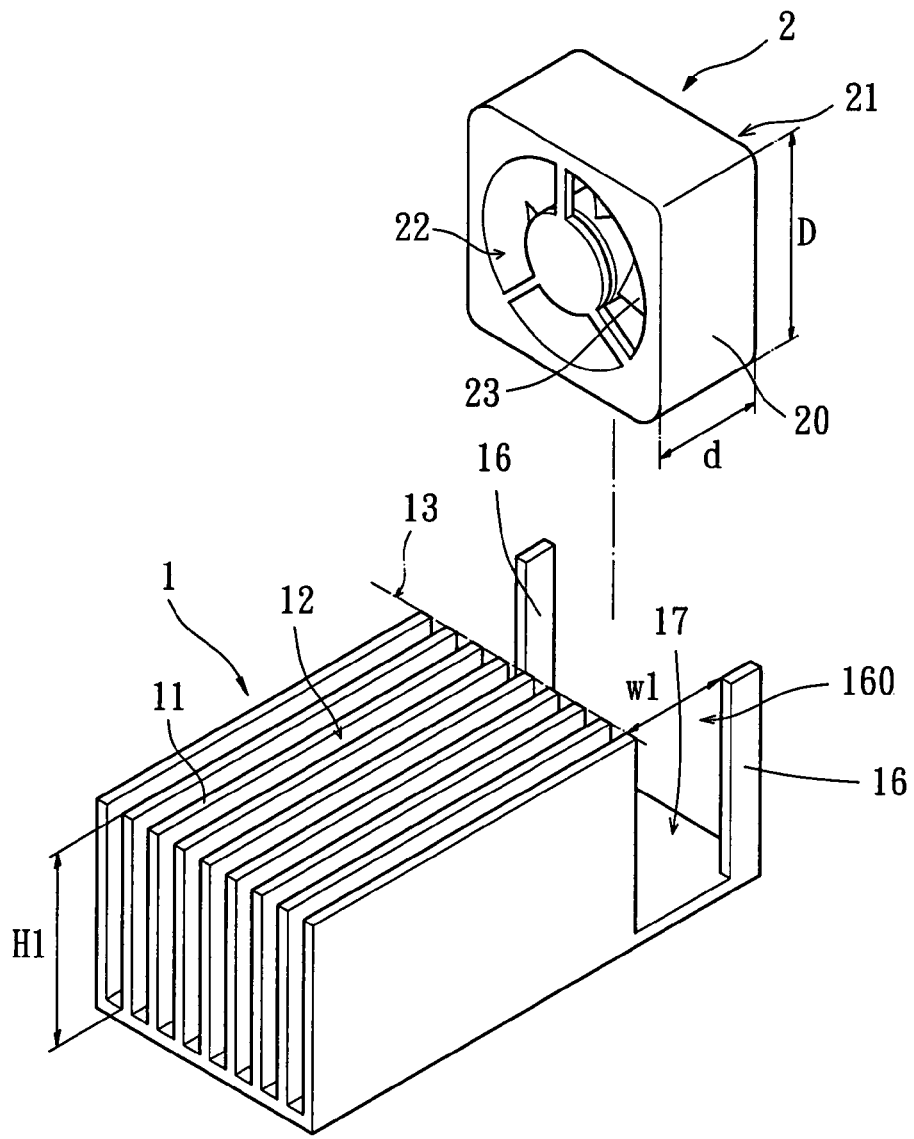
FIG. 7 is an exploded perspective view illustrating a mini-sized heat-dissipating module in accordance with a fifth embodiment of the present invention.

Turning now to FIG. 7, an exploded perspective view of a mini-sized heat-dissipating module in accordance with the fifth embodiment of the present invention is illustrated. In comparison with the first embodiment, the miniature fan unit 2 of the fifth embodiment is in the form of an axial flow type having an axial air inlet and an axial air outlet. The miniature fan unit 2 is stood on the bottom surface of the assembling space 17 of the miniature heat-dissipating plate 1. In this preferred embodiment, each of the engaging members of the miniature heat-dissipating plate 1 is constructed from an engaging stop wall 16. Each of the engaging stop walls 16 is disposed at the distal end of the miniature heat-dissipating plate 1 to define an assembling gap 160 having a width (identified as "w1") spaced apart from the end of the sidewall of the miniature heat-dissipating plate 1. In assembling operation, one of the air inlet 21 and the air outlet 22 may be facing, aligned and connected with one of two ends of the airflow channel 12 of the miniature heat-dissipating plate 1 and the engaging portion 13 as well. When the miniature fan unit 2 is received in the assembling gap 160 of the miniature heat-dissipating plate 1, the housing body 20 is securely engaged between the engaging portion 13 and the engaging stop walls 16.

Once assembled, the miniature fan unit 2 set upright on the miniature heat-dissipating plate 1 takes up a vertical height. In a preferred embodiment, each top of the fins 11 is designed to have a vertical height (identified as "H1") not greater than that of a width (identified as "D") of the housing body 20 so as to reduce the total height of the mini-sized heat-dissipating module or so as not to increase dimensions of the mini-sized heat-dissipating module. Accordingly, the mini-sized heat-dissipating module is suitable for providing in an interior of the miniature electronic device where an installation space is limited.

Figure 8:
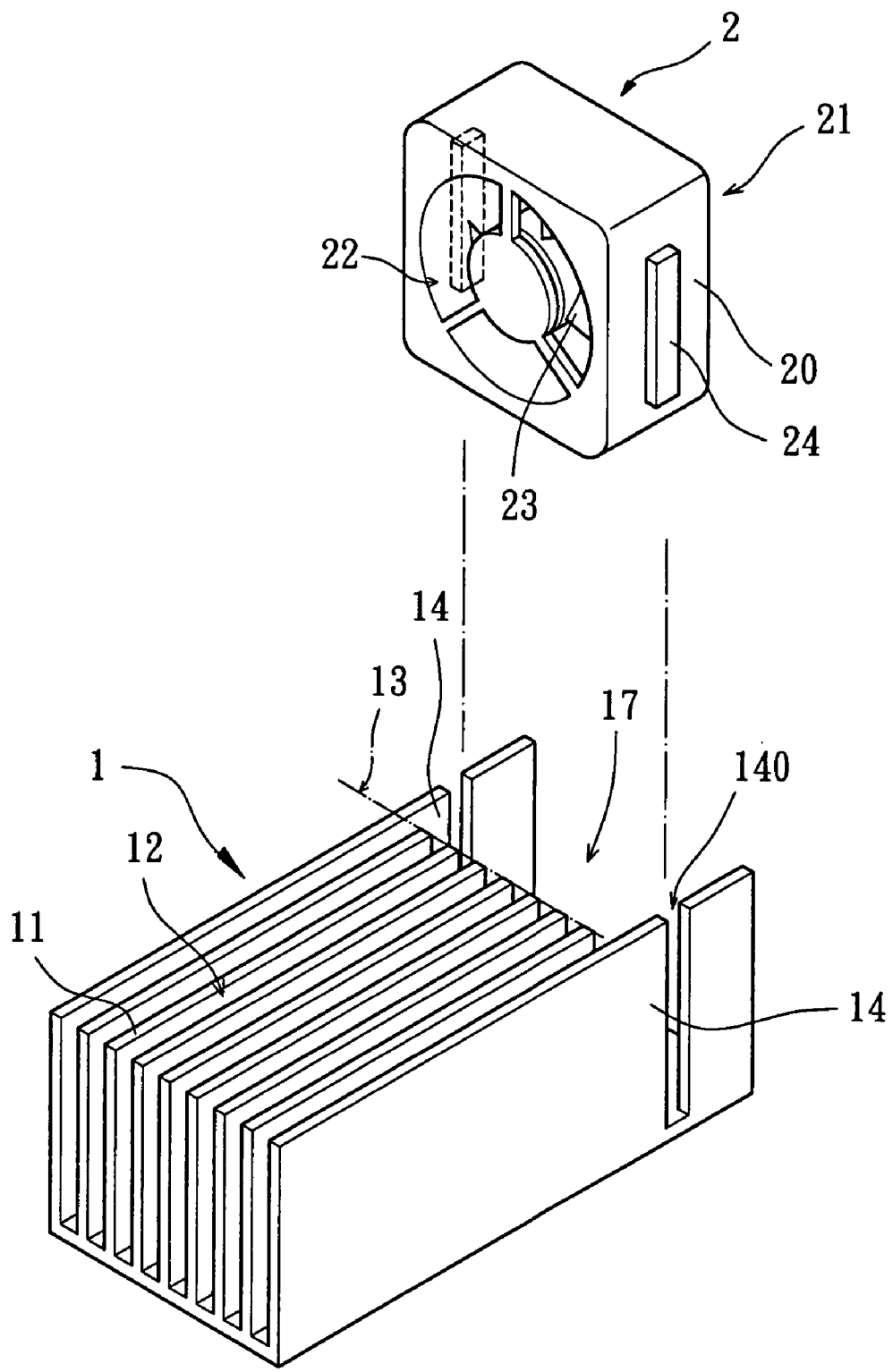
FIG. 8 is an exploded perspective view illustrating a mini-sized heat-dissipating module in accordance with a sixth embodiment of the present invention.

Turning now to FIG. 8, an exploded perspective view of a mini-sized heat-dissipating module in accordance with the sixth embodiment of the present invention is illustrated. In comparison with the first embodiment, each engaging member 14 of the miniature heat-dissipating plate 1 of the fourth embodiment includes a vertically guiding slit 140 which can engage with a protrusion 24 formed on the sidewall of the miniature fan unit 2. The vertically guiding slit 140 of the miniature heat-dissipating plate 1 and the protrusion 24 of the miniature fan unit 2 are provided for easy guidance of the miniature fan unit 2 in a vertical direction of the miniature heat-dissipating plate 1. In a preferred embodiment, each protrusion 24 of the miniature fan unit 2 is securely engaged in the vertically guiding slit 140 of the miniature heat-dissipating plate 1.

As has been discussed above, the fan unit 9 is stacked and mounted on the heat sink member 7 by the fixing elements 8, as shown in FIG. 1. Disadvantageously, there provide a series of the assembling hole 73 of the heat sink member 7 and a series of the through holes 91 of the fan unit 9 in carrying out the stacked heat-dissipating module configuration. Conversely, the miniature heat-dissipating plate 1 of the present invention is designed to provide at least two engaging members to combine the miniature fan unit 2 which includes a fan wheel 23 taking up a maximum area less than 1.6 cm² for rotation.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A mini-sized heat-dissipating module, comprising:
   a miniature heat-dissipating plate having an assembling space, an airflow channel, a plurality of fins and at least two engaging members, the assembling space and the airflow channel provided on a top surface of the miniature heat-dissipating plate, the airflow channel having two ends and parallelly extending along the top surface from one of the two ends to the other of the two ends, the assembling space being arranged adjacent to one of the two ends of the airflow channel, with the fins being arranged in the airflow channel and having distal ends being adjacent to the assembling space to form one of the engaging members; and
   a miniature fan unit mounted in the assembling space of the miniature heat-dissipating plate, with the miniature fan unit having a housing body, an air inlet, an air outlet and a fan wheel, said fan wheel taking up a maximum area less than 1.6 cm$_2$ for rotation;
   wherein the engaging members of the miniature heat-dissipating plate are engaged with the miniature fan unit with the engaging member formed by the distal ends of the fins connecting with one of the air inlet and the air outlet of the miniature fan unit, such that said one of the air inlet and the air outlet faces and is adjacent to and aligned with the end of the airflow channel of the miniature heat-dissipating plate, which end of the airflow channel being the one adjacent to the assembling space.

2. The mini-sized heat-dissipating module as defined in claim 1, wherein one of the engaging members except for the one formed by the distal ends of the fins is extended from a sidewall of the miniature heat-dissipating plate.

3. The mini-sized heat-dissipating module as defined in claim 2, wherein each distal end of the engaging members except for the one formed by the distal ends of the fins is bent to form an inwardly bent lug for positioning the miniature fan unit.

4. The mini-sized heat-dissipating module as defined in claim 1, wherein one of the en a in members except for the one formed by the distal ends of the fins is integrally formed from an extended end edge of the miniature heat-dissipating plate.

5. The mini-sized heat-dissipating module as defined in claim 2, wherein one of the engaging members except for the one formed by the distal ends of the fins is integrally formed from an extended end edge of the miniature heat-dissipating plate.

6. The mini-sized heat-dissipating module as defined in claim 3, wherein one of the engaging members except for the one formed by the distal ends of the fins is integrally formed from an extended end edge of the miniature heat-dissipating plate.

7. The mini-sized heat-dissipating module as defined in claim 1, wherein each of the engaging members is designed to have a vertical height not greater than a thickness of the housing body and each top of the engaging members is at a vertical position not lower than a top edge of the side air outlet of the miniature fan unit.

8. The mini-sized heat-dissipating module as defined in claim 1, wherein each of the engaging members except for the one formed by the distal ends of the fins is constructed from an engaging stop wall disposed at a distal end of the miniature heat-dissipating plate to define an assembling gap in which to receive the miniature fan unit.

9. The mini-sized heat-dissipating module as defined in claim 1, wherein one of the engaging members except for the one formed by the distal ends of the fins includes a vertically guiding slit to engage with a protrusion formed on the miniature fan unit.

10. The mini-sized heat-dissipating module as defined in claim 9, wherein the protrusion of the miniature fan unit is formed on a sidewall of the miniature fan unit.

11. The mini-sized heat-dissipating module as defined in claim 1, wherein an adhesive layer is disposed between a bottom surface of the assembling space and an under surface of the miniature fan unit.

12. The mini-sized heat-dissipating module as defined in claim 1, wherein the miniature fan unit is selected from an axial flow type or a blower type.

* * * * *